(12) United States Patent
Orberk et al.

(10) Patent No.: US 7,863,989 B2
(45) Date of Patent: Jan. 4, 2011

(54) REPLICA-BIAS AUTOMATIC GAIN CONTROL

(75) Inventors: Omer Fatih Orberk, Istanbul (TR); Alexei Shkidt, Newark, CA (US)

(73) Assignee: Spectra Linear, Inc., Santa Clara, CA (US)

( * ) Notice: Subject to any disclaimer, the term of this patent is extended or adjusted under 35 U.S.C. 154(b) by 127 days.

(21) Appl. No.: 12/400,999

(22) Filed: Mar. 10, 2009

(65) Prior Publication Data

US 2009/0224836 A1 Sep. 10, 2009

Related U.S. Application Data

(60) Provisional application No. 61/035,129, filed on Mar. 10, 2008.

(51) Int. Cl.
*H03L 7/00* (2006.01)
(52) U.S. Cl. .................... 331/15; 331/109; 331/158; 331/182; 331/183; 331/185; 331/186
(58) Field of Classification Search .............. 331/15, 331/109, 158, 160, 182, 183, 185, 186
See application file for complete search history.

(56) References Cited

U.S. PATENT DOCUMENTS

| | | | |
|---|---|---|---|
| 5,347,237 A * | 9/1994 | Rokos ................. 331/116 FE |
| 6,278,338 B1 * | 8/2001 | Jansson ................. 331/116 FE |
| 6,577,204 B2 * | 6/2003 | Midtgaard .................... 331/158 |
| 6,798,301 B1 * | 9/2004 | Balan et al. ..................... 331/74 |
| 7,061,337 B2 * | 6/2006 | Partovi et al. ............... 331/109 |
| 7,123,109 B2 * | 10/2006 | Stevenson et al. ............ 331/109 |
| 7,583,151 B2 * | 9/2009 | Fan et al. ........................ 331/15 |
| 2004/0113709 A1 * | 6/2004 | Sibrai et al. .................. 331/182 |
| 2006/0158271 A1 * | 7/2006 | Juang et al. ..................... 331/74 |
| 2008/0297265 A1 * | 12/2008 | Tarng et al. ............. 331/116 R |
| 2009/0146751 A1 * | 6/2009 | Pernia et al. ............ 331/117 R |

* cited by examiner

*Primary Examiner*—Joseph Chang
*Assistant Examiner*—Jeffrey Shin
(74) *Attorney, Agent, or Firm*—Holland & Hart LLP

(57) ABSTRACT

A gain control system comprises a reference stage, a bias replication stage, an operational amplifier, an automatic gain control block, a gain stage, and a crystal oscillator in one embodiment. A negative feedback loop is formed by portions of the operational amplifier, the replica biasing stage, the gain stage, and the automatic gain control stage. The negative feedback loop operatively controls an amplitude of oscillation in the crystal oscillator. The automatic gain control block produces output currents at reference levels in proportion to an input current source. The output current reference levels provide a corresponding yet independent scaling of currents in the bias replication stage and the gain stage. By the scaling capabilities provided a high common mode of voltage is provided between the crystal oscillator and the voltage reference section while stable oscillating characteristics are provided over a broad frequency range.

31 Claims, 4 Drawing Sheets

REPLICA-BIAS AUTOMATIC GAIN CONTROL

CROSS-REFERENCES TO RELATED APPLICATIONS

This application claims priority from co-pending U.S. Provisional Patent Application No. 61/035,129, filed Mar. 10, 2008, entitled "REPLICA-BIAS AUTOMATIC GAIN CONTROL", which is hereby incorporated by reference, as if set forth in full in this document, for all purposes.

BACKGROUND

The present invention relates generally to integrated circuits, and more particularly to automatic gain control circuits.

In many circuits that use oscillators, it may be desirable to simultaneously control multiple characteristics of the oscillator output signal. For example, automatic gain control ("AGC") circuits may typically be used to control the gain of the oscillator output signal by negative feedback. However, controlling the gain may also affect other parameters, like the common mode voltage (i.e., the DC bias level) of the oscillator output signal. In certain applications, affecting other parameters may degrade the overall circuit performance.

As such, it may be desirable to provide circuitry capable of simultaneously controlling both the gain and the common mode of an oscillator output signal.

BRIEF SUMMARY

Among other things, embodiments provided systems and methods for simultaneously controlling both the gain and the common mode of an oscillator output signal. In some embodiments, a gain module controls the gain of an oscillator output signal generated by an oscillator module. Typically, embodiments of the oscillator module include a crystal oscillator that generates an oscillation having an amplitude and a common mode (e.g., a DC bias).

In certain embodiments, the oscillator output signal is monitored by an AGC module, which simultaneously controls two feedback loops. In the first feedback loop the AGC outputs a signal for controlling the gain of the oscillator output signal. The second feedback loop controls the common mode of the oscillator output signal, which may otherwise tend to change as the gain changes. In the second feedback loop, the AGC outputs a signal to a replica bias module, configured to substantially replicate the gain module. The replica gain module may use the AGC output to generate a feedback level, indicating the common mode voltage of the oscillator output signal. The feedback level is compared with a reference level to generate a bias level, which may be fed back for use in controlling the common mode of the oscillator output signal.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a second label that distinguishes among the similar components (e.g., a lower-case character). If only the first reference label is used in the specification, the description is applicable to any one of the similar components having the same first reference label irrespective of the second reference label.

DETAILED DESCRIPTION

In accordance with some embodiments of the invention, the current of a transconductance amplifier is adjusted to control amplitude of an oscillator output signal. While adjusting the current, the common mode of the amplifier's operating point may also change. As the operating point moves away from a high-gain region of operation, the gain may reduce. In some applications, this may cause an undesirable degradation in performance. Thus, it may be desirable to maintain a substantially fixed common mode during operation by providing both amplitude feedback control and common mode feedback control. In other applications, maintaining a fixed common mode may allow reliable usage of voltage-dependant loads for the oscillator. For example, some crystal oscillator configurations may be loaded using a varactor, or similar component, having a voltage-controlled capacitance. A fixed common mode voltage may maintain proper biasing of the varactors, thereby maintaining desired loading of the crystal oscillator. In one embodiment, the common mode feedback control is implemented without significantly compromising area, power, or bandwidth, and while maintaining stable operation.

Figure 1:
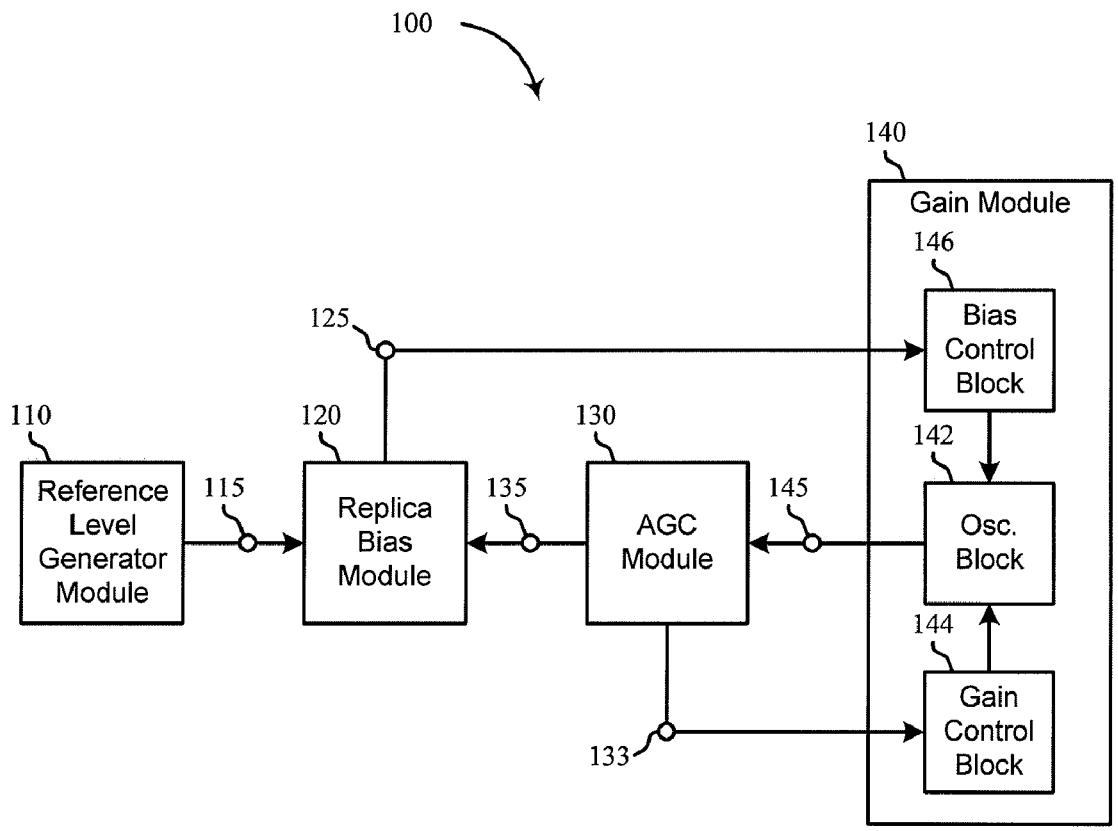
FIG. 1 shows a high level block diagram of an oscillator control system, according to various embodiments of the invention.

FIG. 1 shows a high level block diagram of an oscillator control system 100 for substantially simultaneously controlling both the gain and the common mode of an oscillator output signal 150, according to various embodiments of the invention. The oscillator control system 100 includes a reference level generator module 110, a replica bias module 120, an automatic gain control ("AGC") module 130, and a gain module 140. Embodiments of the gain module 140 include an oscillation block 142 controlled at least partially be a gain control block 144 and a bias control block 146.

The oscillation block 142 includes an oscillator that generates an oscillator output signal 145. In some embodiments, the oscillator is a crystal oscillator. The oscillator output signal 145 has an amplitude level and a common mode level. For example, the oscillator output signal 145 may oscillate at a certain amplitude around a DC bias level that is its common mode level. In some embodiments, the gain control block 144 is configured to control the gain (e.g., and thereby control the amplitude) of the oscillator output signal 145, and the bias control block 146 is provided to control the common mode of the oscillator output signal 145.

The oscillator output signal 145 is communicated to the AGC module 130. In some embodiments, the AGC module 130 is implemented substantially according to an embodiment described in U.S. patent application Ser. No. 12/395,854, filed Mar. 4, 2008, entitled "EXTENDED RANGE OSCILLATOR", which is hereby incorporated by reference, as if set forth in full in this document, for all purposes. The AGC module 130 is configured to monitor characteristics of the oscillator output signal 145, including the gain and common mode of the oscillator output signal 145, and to generate two output signals, a gain control signal 133 and a replica control signal 135. In some embodiments, the gain control signal 133 and the replica control signal 135 are substantially equal over a range of operation. The gain control signal 133 is fed back to the gain control block 144 to control the magnitude of gain provided from the gain control block 144 to the oscillation block 142. In some embodiments, the gain control signal 133 and the gain control block 144 provide a negative feedback control loop for controlling the amplitude of the oscillator output signal 145.

For example, when the oscillation block 142 initiates oscillation, the amplitude of the oscillator output signal 145 may be substantially zero. The AGC module 130 generates a gain control signal 133 that controls the gain control block 144 to provide a maximum amount of gain to the oscillation block 142, allowing the oscillator to have sufficient startup gain. As the amplitude of the oscillator output signal 145 increases, the AGC module 130 detects the increase in amplitude (e.g., by detecting an envelope of the oscillator output signal 145) and adjusts the gain control signal 133 to reduce the gain provided by the gain control block 144 to the oscillation block 142. This may allow the amplitude to increase substantially to a steady state in a controlled manner.

In some embodiments, the amplitude and common mode levels are interrelated. For example, the gain control block 144 may adjust a magnitude of current applied to the oscillation block 142 (e.g., as a function of the gain control signal 133), thereby adjusting the amplitude of the oscillator output signal 145. As the magnitude of current changes, however, the common mode level of the oscillator output signal 145 may also shift. In certain embodiments, the AGC module 130 is configured to directly monitor the common mode of the oscillator output signal 145, and to output the replica control signal 135 as a function of the common mode level. In other embodiments, the AGC module 130 is configured to monitor only the amplitude of the oscillator output signal 145, and to output the replica control signal 135 as a function of the common mode level. The replica control signal 135 is then used to recreate the common mode level of the oscillator output signal through the replica bias module.

The replica control signal 135 is communicated to the replica bias module 120. In some embodiments, the replica bias module 120 is configured to replicate the functionality of the gain module 140. As such, monitoring and/or affecting characteristics of the replica bias module 120 may allow the indirect monitoring and/or affecting of characteristics of the gain module 140. Certain embodiments of the replica bias module 120 include a topology that is substantially identical to the topology of the gain module 140, with substantially identical relative component characteristics (e.g., proportional).

In some embodiments, the replica bias module 120 generates a feedback level as a function of the replica control signal 135. The feedback level may indicate the common mode level of the oscillator output signal 145. For example, the replica bias module 120 may include the same components in the same topology as the gain module 140, but proportionally sized. The feedback level, then, may be proportionally related to the common mode level of the oscillator output signal 145.

The feedback level may then be compared in the replica bias module 120 to a reference level. In some embodiments, the reference level is generated by the reference level generator module 110. The reference level generator module 110 may include any components configured to generate the desired reference level, including voltage sources, current sources, resistor networks, transistor topologies, etc. In certain embodiments, the reference level generator module 110 is configured to have a substantially similar topology to that of the gain module 140 and/or the replica bias module 120.

The comparison of the reference level with the feedback level may generate a bias level. In some embodiments, the bias level is replicated as a bias control signal 125. The bias control signal 125 may be fed back to the bias control block 146 in the gain module 140, and used to control the common mode of the oscillator output signal 145. For example, the bias control block 146 may control the DC bias at the negative side of the oscillator output signal 145 as a function of the bias control signal 125.

In certain embodiments, the replica bias module 120 provides a replica of the gain module 140. As such, the replica bias module 120 may include a replica gain control block and a replica bias control block. By replicating the gain module 140, the replica bias module 120 may indirectly monitor substantially isolated effects of common mode changes on the operation of the gain module 140. These replica bias module 120 may then determine how to control the common mode changes, and feed back the bias control signal 125 as a function of that determination, for use in controlling the actual (e.g., rather than the replicated or proportionally replicated) common mode changes of the oscillator output signal 145.

Figure 2:
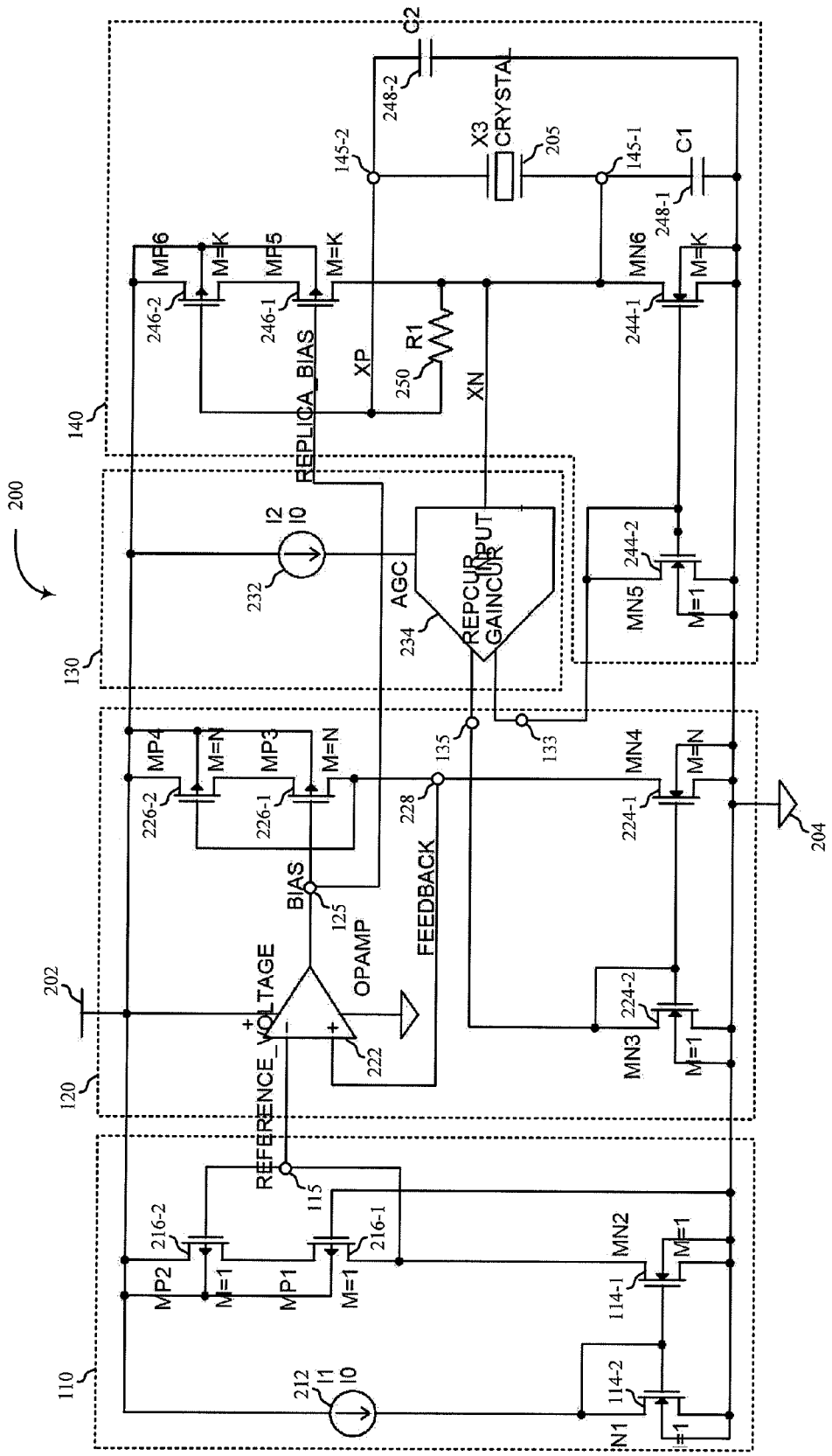
FIG. 2 shows a schematic diagram of an illustrative oscillator control circuit, according to various embodiments of the invention.

It will be appreciated that the various blocks of the oscillator control system 100 may be implemented in a number of different ways. FIG. 2 shows a schematic diagram of an illustrative oscillator control circuit 200, according to various embodiments of the invention. As in FIG. 1, the oscillator control circuit 200 includes embodiments of a reference level generator module 110, a replica bias module 120, an AGC module 130, and a gain module 140. While similar functional modules are indicated with the same reference numerals as in FIG. 1, the implementation of FIG. 2 is intended only to provide a non-limiting, enabling embodiment.

The gain module 140 includes an oscillator 205 and oscillation resistor 250, connected in parallel between a positive oscillator output signal node 145-2 and a negative oscillator output signal node 145-1. The oscillator 205 may be configured as a Pierce oscillator configuration. In some embodiments, tuning capacitors 248 are included to help tune the oscillation of the oscillator 205. In some embodiments, the tuning capacitors 248 are implemented as voltage-controlled loads, like varactors. It will be appreciated that maintenance of a substantially fixed common mode voltage, as provided by some embodiments of the invention, may maintain proper biasing of the varactors. This may be desirable to provide reliable loading of the crystal oscillator.

A first gain PMOS transistor 246-1 and a second gain PMOS transistor 246-2 are connected in series between a source voltage 202 and the negative oscillator output signal node 145-1. A first gain NMOS transistor 244-1 is connected between the negative oscillator output signal node 145-1 and ground 204. Current is mirrored into the first gain NMOS transistor 244-1 from a second gain NMOS transistor 244-2, connected between a gain control signal 133 node of the AGC module 130 and ground 204.

Embodiments of the AGC module 130 include an AGC block 234 and an AGC current source 232. The AGC current source 232 is configured to supply substantially constant current to the AGC block 234, for example, such that the AGC block 234 can maintain stable internal reference levels. The input to the AGC block 234 is tied to the negative oscillator output signal node 145-1. In some embodiments, the AGC block 234 is configured to detect the amplitude (e.g., or the envelope) of the output of the oscillator 205 from the signal present at the negative oscillator output signal node 145-1.

The AGC block 234 uses this information to generate the gain control signal 133 and a replica control signal 135. In some embodiments, the gain control signal 133 and the replica control signal 135 are functionally related to the amplitude of the output of the oscillator 205. In other embodiments, the replica control signal 135 is functionally related to the common mode of the output of the oscillator 205.

The gain control signal 133 may be fed back to the gain module 140 via the second gain NMOS transistor 244-2, so that a magnitude of current flows through the second gain NMOS transistor 244-2 as a function of the gain control signal 133. This current may be mirrored into the first gain NMOS transistor 244-1. The first gain NMOS transistor 244-1 is configured to at least partially control the current applied to the oscillator 205, and thereby control the amplitude of the output of the oscillator 205.

For example, when the oscillator 205 initiates oscillation, the amplitude of the output of the oscillator 205 may be substantially zero, as reflected by a substantially zero level seen at the negative oscillator output signal node 145-1. The AGC block 234 may compare the level seen at the negative oscillator output signal node 145-1 against an internal reference, and generate a gain control signal 133 as a function of that comparison. The gain control signal 133 may be generated so that a maximum amount of current flows through the second gain NMOS transistor 244-2 (e.g., by providing a high gate voltage to the second gain NMOS transistor 244-2). Mirroring this effect to the first gain NMOS transistor 244-1 may cause a maximum amount of current also to flow through the first gain NMOS transistor 244-1. This may provide a maximum amount of gain to the oscillator 205, for example, allowing the oscillator 205 to reliably initiate oscillation and rapidly increase its output amplitude. As the amplitude increases, the amplitude level (e.g., the envelope of the signal) at the negative oscillator output signal node 145-1 may similarly increase. The AGC block 234 continues to compare this rising amplitude level against its internal reference, causing it to reduce the level of the gain control signal 133 as the amplitude level increases. Reducing the level of the gain control signal 133 may reduce current flow through the gain NMOS transistors 244, thereby reducing gain applied to the oscillator 205. In this way, the gain may be smoothly and reliably reduced as the amplitude controllably approaches a steady state level.

The AGC block 234 also outputs the replica control signal 135, which may be received by the replica bias module 120. In some embodiments, or at some output levels of the oscillator 205, the replica control signal 135 is substantially equal to the gain control signal 133. Embodiments of the replica bias module 120 include a comparison block 222, and a number of transistors configured in a topology that is substantially identical to the topology of the gain module 140. A first replica PMOS transistor 226-1 and a second replica PMOS transistor 226-2 are connected in series between the source voltage 202 and a replica feedback node 228. A first replica NMOS transistor 224-1 is connected between the replica feedback node 228 and ground 204. Current is mirrored into the first replica NMOS transistor 224-1 from a second replica NMOS transistor 224-2, connected between the replica control signal 135 node of the AGC block 234 and ground 204.

In some embodiments, the ratio between the first gain NMOS transistor 244-1 and the second gain NMOS transistor 244-2 is K-to-1, where K is a first constant. Similarly, the ratio between the first replica NMOS transistor 224-1 and the second replica NMOS transistor 224-2 is N-to-1, where N is a second constant. As such, the ratio of the first gain NMOS transistor 244-1 to the first replica NMOS transistor 224-1 is substantially K-to-N. Similarly, the ratios between the gain PMOS transistors 246 and the replica PMOS transistors 226 are substantially K-to-N. In some embodiments, the replica control signal 135 is configured so that the level at the replica feedback node 228 (generated by using the replica control signal 135 to control current through the replica NMOS transistors 224) is proportional to the common mode level at the negative oscillator output signal node 145-1. It will be appreciated that, with a proportional relationship between the replica feedback level and the common mode level, and a proportional relationship between the transistors in the gain module 140 and the replica bias module 120, there may be proportional effects seen at respective nodes in the gain module 140 and the replica bias module 120.

The replica feedback level seen at the replica feedback node 228 may be communicated to one comparison input of the comparison block 222. The other comparison input of the comparison block 222 may be tied to a reference level. In some embodiments, the reference level is generated by the reference level generator module 110. In the embodiment shown, the reference level generator module 110 includes a reference current source 212, configured to supply substantially constant current to a transistor topology that is substantially identical to that of the gain module 140 and/or the replica bias module 120.

A first reference PMOS transistor 216-1 and a second reference PMOS transistor 216-2 are connected in series between the source voltage 202 and a reference node 115. A first reference NMOS transistor 214-1 is connected between the reference node 115 and ground 204. Current is mirrored into the first reference NMOS transistor 214-1 from a second reference NMOS transistor 214-2, connected between the reference current source 212 and ground 204. In one embodiment, the transistors in the reference level generator module 110 are sized to substantially match the second gain NMOS transistor 244-2 and or the second replica NMOS transistor 224-2. For example, the ratio of the first gain NMOS transistor 244-1 to each of the transistors in the reference level generator module 110 may be K-to-1. As such, there may be proportional effects seen at respective nodes in the gain module 140, the replica bias module 120, and the reference level generator module 110, with the proportionality being substantially K-to-N-to-1.

When the comparison block 222 compares the reference level at the reference node 115 with the feedback level seen at the replica feedback node 228, a bias control level is generated on a bias control signal 125 node at the output of the comparison block 222. In some embodiments, the comparison block 222 includes an operational amplifier. The reference node 115 may be tied to a negative input terminal of the operational amplifier and the replica feedback node 228 may be tied to a positive input terminal of the operational amplifier. In this configuration, the output of the operational amplifier, the bias control level, may be a function of the difference between the feedback level and the reference level.

The bias control level is replicated at (e.g., the bias control signal 125 node is tied to) the gate of the first gain PMOS transistor 246-1. In this way, the impedance of the first gain PMOS transistor 246-1 is controlled as a function of the bias control signal 125. Because the first gain PMOS transistor 246-1 is tied to the negative oscillator output signal node 145-1, controlling the impedance of the first gain PMOS transistor 246-1 may effectively control the bias level on the negative oscillator output signal node 145-1, thereby controlling the common mode of the output of the oscillator 205.

Figure 3:
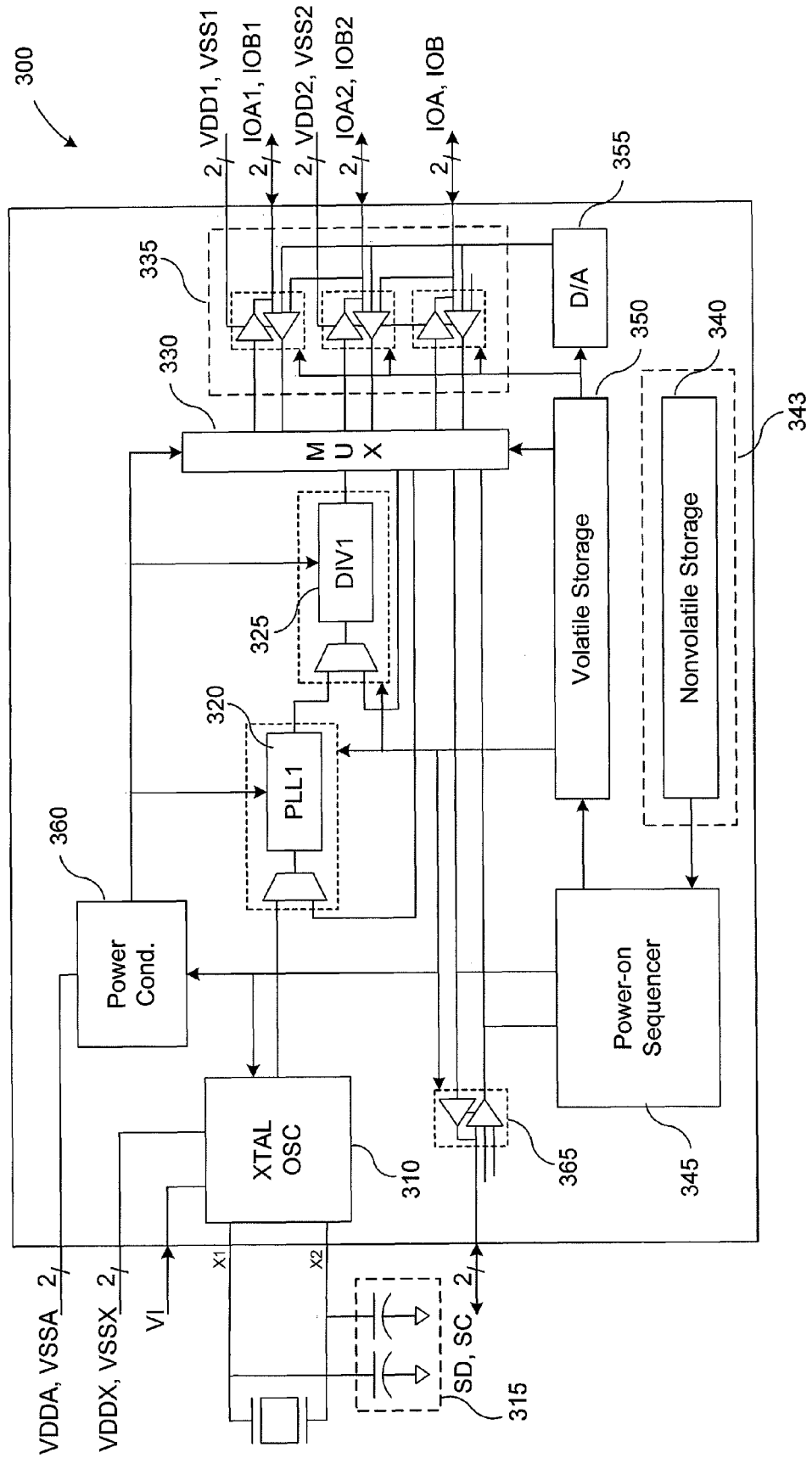
FIG. 3 illustrates a simplified block diagram of a clock circuit arrangement, for use with various embodiments of the invention.

It will be appreciated that modifications may be made to the implementations embodied in FIG. 2, without departing from the scope of the invention. Further, embodiments of the oscillator control system 100 of FIG. 1 and/or the oscillator control circuit 200 of FIG. 2 may be incorporated into a larger system or circuit arrangement. FIG. 3 illustrates a simplified block diagram of a clock circuit arrangement 300, for use with various embodiments of the invention.

An external crystal is connected to a voltage controlled crystal oscillator ("VCXO") 310 in an exemplary embodiment. A pair of capacitors 315 connect crystal oscillator inputs X1, X2 to ground. In some embodiments, the capacitors 315 are implemented as voltage-controlled loads, like varactors. VCXO power ("VDDX"), VCXO ground ("VSSX"), and VCXO input voltage ("VI") are external inputs to the VCXO 310. In some embodiments, the VCXO 310 is implemented according to an embodiment of the present invention. For example, embodiments of oscillator control system 100 of FIG. 1 and/or the oscillator control circuit 200 of FIG. 2 may be included in implementations of the VCXO 310 to provide functionality of the crystal oscillator.

An output of the VCXO 310 is connected with an input multiplexer ("mux") of a phase lock loop (PLL1) 320, providing a reference signal for the PLL 320. In some embodiments, additional PLLs 320 may be used to allow for additional I/Os and further programmability. An output of the phase lock loop 320 is connected with the input multiplexer of a PLL divider ("DIV1") 325. An output of the PLL divider 325 is fed to a MUX 330. A first set of outputs of the MUX 330 are connected with programmable input/output buffers 335. Additional outputs from the MUX 330 may be connected with the input mux of PLL1 320 and the input mux of the PLL divider 325.

The clock generator circuit 300, including a nonvolatile storage array 340, may be fabricated, for example, in a single monolithic semiconductor substrate or alternately, the nonvolatile storage array 340 may reside on a second semiconductor substrate 343. An output of the nonvolatile storage array 340 may be in communication with a power-on sequencer 345. The power-on sequencer 345 may communicate with a volatile storage array 350.

The volatile storage array 350 is in communication with a digital-to-analog ("D/A") block 355, a power conditioner block 360, a serial input/output ("I/O") block 365, the programmable input/output buffers 335, the mux 330, the PLL 320, the PLL divider 325, and the VCXO 310. The serial I/O block 365 communicates with serial data and serial clock inputs SD, SC, the power-on sequencer 345, and the MUX 330. The power conditioner block 360 is connected with PLL power inputs VDDA, VSSA.

Figure 4:
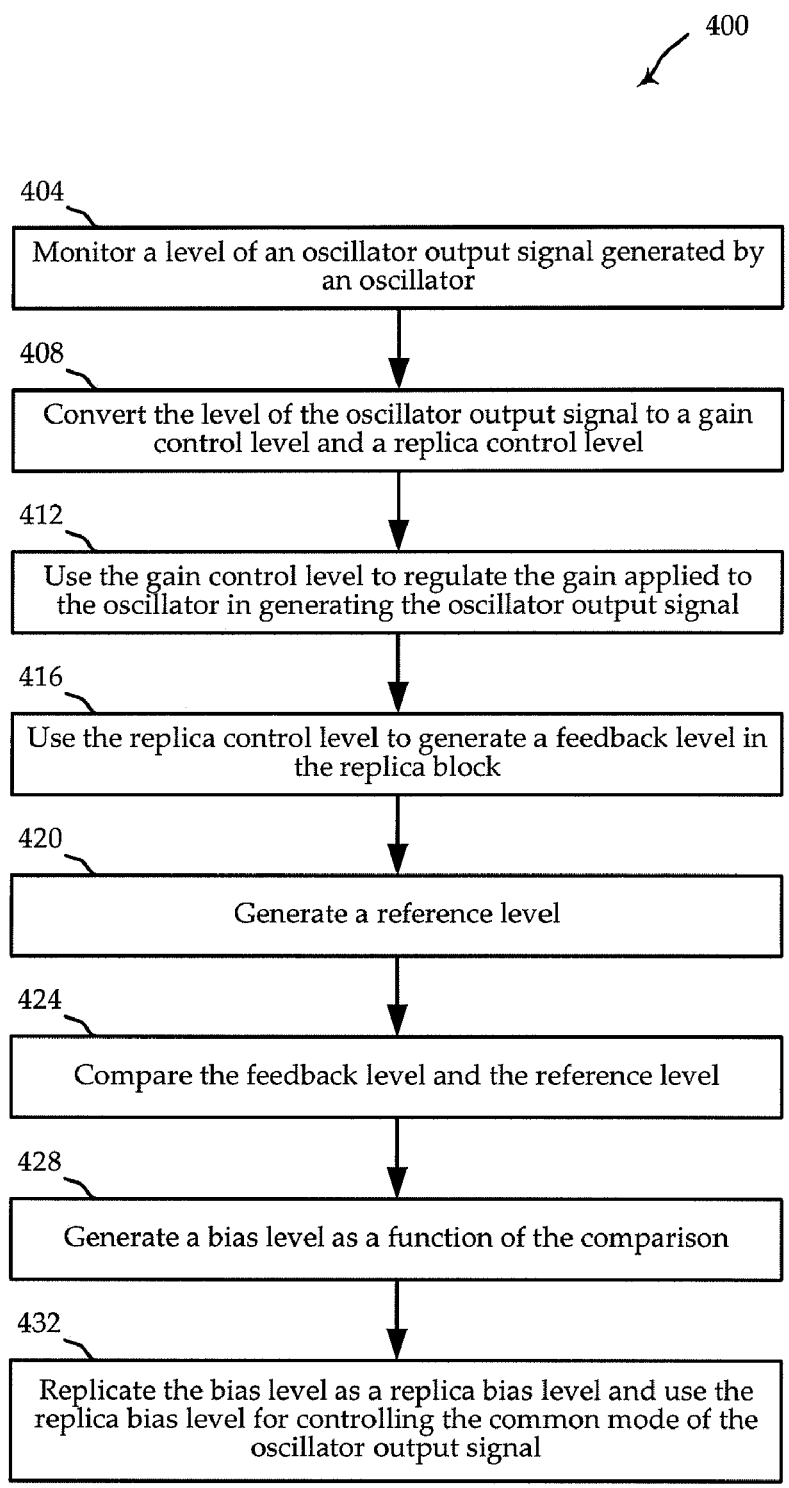
FIG. 4 shows a flow diagram of a method for controlling an oscillator output signal, according to various embodiments of the invention.

It will be appreciated that the circuits described above provide only exemplary systems for providing functionality according to embodiments of the invention. For example, those and other embodiments may perform the method of FIG. 4. FIG. 4 shows a flow diagram of a method 400 for controlling both the gain and the common mode of an oscillator output signal, according to various embodiments of the invention.

In some embodiments, the method begins at block 404 by monitoring a level of an oscillator output signal generated by an oscillator. In some embodiments, a gain block is configured to provide gain to an oscillator, thereby affecting the level of the oscillator output signal. The level of the oscillator output signal may, for example, be its amplitude or its envelope.

The level of the oscillator output signal is then converted at block 408 to a gain control level and a replica control level. At block 412, the gain control level is used to regulate the gain provided by the gain block to the oscillator. In some embodiments, the gain control level effectively provides negative feedback, such that the gain is decreased as the level of the oscillator output signal increases. For example, some embodiments of blocks 408 and 412 are implemented using an AGC module.

At block 416, the replica control level is used by the replica block to generate a feedback level. The feedback level is functionally related to a common mode level of the oscillator output signal. In some embodiments, a reference level is generated at block 420. The feedback level generated in block 416 and the reference level generated in block 420 are then compared in block 424. For example, the comparison may be implemented using an operational amplifier.

At block 428, a bias level is generated as a function of the comparison in block 424. For example, the bias level may be implemented as the output of an operational amplifier used to compare the reference level and feedback level at its inputs. The bias level is then replicated as a replica bias level at block 432 for use in controlling the gain provided by the gain block (e.g., by controlling certain impedances of components of the gain block). Replicating the bias level in block 432 may include tying a replica bias level node to a bias level node. In some embodiments, the relationship between the bias level and the feedback level from the perspective of the replica block is related (e.g., proportional) to the relationship between the replica bias level and the common mode level from the perspective of the gain block.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

It should also be appreciated that the following systems and methods may individually or collectively be components of a larger system, wherein other procedures may take precedence over or otherwise modify their application. Also, a number of steps may be required before, after, or concurrently with the following embodiments. Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Accordingly, the above description should not be taken as limiting the scope of the invention, which is defined by the appended claims.

What is claimed is:

1. An oscillator control system comprising:
   an oscillation module configured to output an oscillator output signal having an amplitude and a common mode;
   an automatic gain control (AGC) module in operative communication with the oscillation module, and configured to:
      generate a gain control signal as a function of the amplitude of the oscillator output signal; and
      generate a replica control signal as a function of the amplitude of the oscillator output signal;
   a gain control module, in operative communication with the oscillation module, and configured to provide a magnitude of gain to the oscillation module as a function of the gain control signal;
   a replica bias module, in operative communication with the AGC module, and configured to:
      generate a replica feedback signal as a function of the replica control signal;
      compare the replica feedback signal with a reference signal; and
      generate a bias control signal as a function of comparing the replica feedback signal with the reference signal; and
   a bias control module, in operative communication with the replica bias module and the oscillation module, and configured to control the common mode of the oscillator output signal as a function of the bias control signal.

2. The oscillator control system of claim 1, wherein the AGC module comprises:
   an AGC reference generator block, configured to generate a reference gain level;
   an amplitude detector block, configured to monitor the amplitude of the oscillator output signal; and
   an AGC comparison block, configured to generate the gain control signal as a function of a comparison between the amplitude of the oscillator output signal and the reference gain level.

3. The oscillator control system of claim 2, wherein the AGC module comprises:
   a current source configured to output a substantially constant magnitude of current,
   wherein the AGC reference generator block is configured to generate the reference gain level as a function of the magnitude of current output by the current source.

4. The oscillator control system of claim 2, wherein the AGC module comprises:
   a current source configured to output a substantially constant magnitude of current,
   wherein the gain control signal and the replica control signal are generated further as a function of the magnitude of current output by the current source.

5. The oscillator control system of claim 2,
   wherein the AGC comparison block is configured to generate the gain control signal such that the gain control signal is functionally related to the amplitude of the oscillator output signal.

6. The oscillator control system of claim 1, further comprising:
   a reference generator module, configured to generate the reference signal.

7. The oscillator control system of claim 6, wherein:
   the reference generator module comprises a first current source and the AGC module comprises a second current source.

8. The oscillator control system of claim 7, wherein:
   each of the first current source and the second current source is configured to output substantially a same magnitude of current.

9. The oscillator control system of claim 6, wherein:
   the reference generator module is configured to generate the reference signal as a function of a first scaling factor; and
   the AGC module is configured to generate the replica control signal as a function of a second factor, the second factor being a multiple of the first scaling factor.

10. The oscillator control system of claim 6, wherein:
    the reference generator module is configured to generate the reference signal as a function of a first scaling factor; and
    the gain control module is configured to generate the magnitude of gain as a function of a second factor, the second factor being a multiple of the first scaling factor.

11. The oscillator control system of claim 6, wherein:
    the reference generator module is configured to generate the reference signal as a function of a first scaling factor; and
    the AGC module is configured to generate the replica control signal as a function of a second factor, the second factor being a multiple of the first scaling factor;
    the gain control module is configured to generate the magnitude of gain as a function of a third factor, the third factor being a multiple of the first scaling factor.

12. The oscillator control system of claim 6, further comprising:
    a gain module, comprising the gain control module and the bias control module, the gain module being configured according to a first topology,
    wherein the reference generator is configured according to a second topology, the second topology being substantially identical to the first topology.

13. The oscillator control system of claim 1, wherein:
    the replica bias module comprises a set of devices, each device having a magnitude of transconductance, the replica feedback signal being generated as a function of the replica control signal and the magnitude of transconductance.

14. The oscillator control system of claim 1, further comprising:
    a gain module, comprising the gain control module and the bias control module, the gain module being configured according to a first topology, the first topology comprising a first set of devices, each of the first set of devices having a magnitude of transconductance.

15. The oscillator control system of claim 14, wherein:
    the replica bias module is configured according to a second topology, the second topology comprising a second set of devices, each of the second set of devices corresponding to one of the first set of devices and having a magnitude of transconductance that is a multiple of the magnitude of transconductance of the corresponding one of the first set of devices.

16. The oscillator control system of claim 14, further comprising:
    a reference generator module, configured to generate the reference signal,
    wherein the reference generator module is configured according to a second topology, the second topology comprising a second set of devices, each of the second set of devices corresponding to one of the first set of devices and having a magnitude of transconductance that is a multiple of the magnitude of transconductance of the corresponding one of the first set of devices.

17. The oscillator control system of claim 14, further comprising:
a reference generator module, configured to generate the reference signal,
wherein the reference generator module is configured according to a second topology, the second topology comprising a second set of devices, each of the second set of devices corresponding to one of the first set of devices and having a magnitude of transconductance that is a multiple of the magnitude of transconductance of the corresponding one of the first set of devices, and
wherein the replica bias module is configured according to a third topology, the third topology comprising a third set of devices, each of the third set of devices corresponding to one of the first set of devices and having a magnitude of transconductance that is a multiple of the magnitude of transconductance of the corresponding one of the first set of devices.

18. The oscillator control system of claim 14, wherein the first set of devices comprises:
an NMOS transistor, a first PMOS transistor, and a second a PMOS transistor, coupled in series to form a current path between a source voltage terminal and a ground terminal,
wherein the NMOS transistor is controlled as least partially as a function of the gain control signal, and
the first PMOS transistor is controlled at least partially as a function of the bias control signal.

19. The oscillator control system of claim 1, wherein the gain control signal and the replica control signal are configured to be substantially equal over a portion of an operating range of the oscillation block.

20. The oscillator control system of claim 1, wherein the oscillation module comprises a crystal oscillator configured to generate the oscillator output signal.

21. The oscillator control system of claim 20, wherein the crystal oscillator is configured in a Pierce oscillator configuration.

22. A clock circuit arrangement comprising:
an oscillation module configured to output an oscillator output signal having an amplitude, a common mode, and an oscillation frequency;
an automatic gain control (AGC) module in operative communication with the oscillation module, and configured to:
generate a gain control signal as a function of the amplitude of the oscillator output signal; and
generate a replica control signal as a function of the amplitude of the oscillator output signal;
a gain control module, in operative communication with the oscillation module, and configured to provide a magnitude of gain to the oscillation module as a function of the gain control signal;
a replica bias module, in operative communication with the AGC module, and configured to:
generate a replica feedback signal as a function of the replica control signal;
compare the replica feedback signal with a reference signal; and
generate a bias control signal as a function of comparing the replica feedback signal with the reference signal;
a bias control module, in operative communication with the replica bias module and the oscillation module, and configured to control the common mode of the oscillator output signal as a function of the bias control signal; and
a clock processing module, in operative communication with the oscillation module, and configured to generate at least one clock output signal as a function of the oscillation frequency.

23. The clock circuit arrangement of claim 22, wherein the clock processing module comprises:
a phase lock loop configured to generate each of the at least one clock output signal to have a respective output clock frequency, each respective output clock frequency being mathematically related to the oscillation frequency.

24. The clock circuit arrangement of claim 22, further comprising:
a programming module, configured to output at least one configuration signal as a function of a programming configuration, the at least one configuration signal being configured to affect operation of at least one of the oscillation module, the AGC module, the gain control module, the replica bias module, the bias control module, or the clock processing module.

25. The clock circuit arrangement of claim 22, further comprising:
a gain module, comprising the gain control module and the bias control module, the gain module being configured according to a first topology, the first topology comprising a first set of devices, each of the first set of devices having a magnitude of transconductance.

26. The clock circuit arrangement of claim 25, wherein:
the replica bias module is configured according to a second topology, the second topology comprising a second set of devices, each of the second set of devices corresponding to one of the first set of devices and having a magnitude of transconductance that is a multiple of the magnitude of transconductance of the corresponding one of the first set of devices.

27. The clock circuit arrangement of claim 25, further comprising:
a reference generator module, configured to generate the reference signal,
wherein the reference generator module is configured according to a second topology, the second topology comprising a second set of devices, each of the second set of devices corresponding to one of the first set of devices and having a magnitude of transconductance that is a multiple of the magnitude of transconductance of the corresponding one of the first set of devices.

28. The clock circuit arrangement of claim 22, further comprising:
a housing, comprising a set of interface terminals, the housing configured to:
at least partially house the oscillation module, the AGC module, the gain control module, the replica bias module, the bias control module, and the clock processing module; and
provide at least one external coupling to the clock processing module via the set of interface terminals.

29. A method for controlling an output of an oscillator, the method comprising:
determining an amplitude level of the output of the oscillator;
determining a common mode level of the output of the oscillator;
generating a gain control signal as a function of the amplitude level;
generating a replica control signal as a function of the amplitude level;
generating a replica feedback signal as a function of the replica control signal;

generating a bias control signal as a function of a comparison between the replica control signal and a reference level;

regulating the amplitude level as a function of the gain control signal;

regulating the common mode level as a function of the bias control signal.

30. The method of claim 29, wherein:

generating the gain control signal as a function of the amplitude level comprises:

generating a second reference level;

comparing the amplitude level with the second reference level; and generating the gain control signal as a function of comparing the amplitude level with the second reference level.

31. The method of claim 29, further comprising:

generating the reference level.

* * * * *